United States Patent
Higuchi et al.

(10) Patent No.: US 10,816,141 B2
(45) Date of Patent: Oct. 27, 2020

(54) CHEMICAL SOLUTION FEEDER, SUBSTRATE TREATMENT APPARATUS, METHOD FOR FEEDING CHEMICAL SOLUTION, AND METHOD FOR TREATING SUBSTRATE

(71) Applicant: SCREEN Holdings Co., Ltd., Kyoto (JP)

(72) Inventors: Ayumi Higuchi, Kyoto (JP); Eri Fujita, Kyoto (JP); Shota Iwahata, Kyoto (JP); Masayuki Otsuji, Kyoto (JP); Yoshiyuki Fujitani, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/021,358

(22) Filed: Jun. 28, 2018

(65) Prior Publication Data

US 2019/0056066 A1 Feb. 21, 2019

(30) Foreign Application Priority Data

Aug. 16, 2017 (JP) .................................. 2017-157115

(51) Int. Cl.
*F17D 3/01* (2006.01)
*B01D 19/00* (2006.01)
*B01D 21/00* (2006.01)

(52) U.S. Cl.
CPC ............ *F17D 3/01* (2013.01); *B01D 19/0031* (2013.01); *B01D 19/0068* (2013.01); *B01D 21/00* (2013.01)

(58) Field of Classification Search
CPC ......... F17D 3/01; F17D 3/14; B01D 19/0031; B01D 19/0068; B01D 21/00; B01D 2239/0421

See application file for complete search history.

(56) References Cited

U.S. PATENT DOCUMENTS 4,004,587 A * 1/1977 Jess .......................... A61M 5/14
604/126
7,108,737 B2 * 9/2006 Neumann .......... B01D 53/1418
95/214

(Continued)

FOREIGN PATENT DOCUMENTS

CN 102134708 A 7/2011
CN 104289009 A 1/2015

(Continued)

OTHER PUBLICATIONS

Notification of Examination Opinion and Search Report dated Nov. 13, 2019 in corresponding Taiwanese Patent Application No. 107122125 and partial English translation. The partial English translation is based on the attached Japanese translation.

(Continued)

*Primary Examiner* — Kevin F Murphy
*Assistant Examiner* — Jonathan J Waddy
(74) *Attorney, Agent, or Firm* — Ostrolenk Faber LLP

(57) ABSTRACT

A chemical solution feeder feeds a chemical solution to a predetermined feed target, and includes: a feed flow path that is connected at its one end to a supply source of a chemical solution at room temperature and at its other end to a feed target, to guide the chemical solution to the feed target from the supply source; a first filter that removes particles in a chemical solution at room temperature injected from the supply source into the feed flow path; a heating unit that heats the chemical solution having passed through the first filter; and a second filter that removes particles in the chemical solution at high temperature heated by the heating unit, flowing through the feed flow path toward the feed target, wherein the first filter is a hydrophilic filter and the second filter is a hydrophobic filter.

14 Claims, 7 Drawing Sheets

(56) References Cited

U.S. PATENT DOCUMENTS

| | | | |
|---|---|---|---|
| 7,225,949 B2 | 6/2007 | Kubo et al. | |
| 2002/0139738 A1* | 10/2002 | Fujie | B01D 61/18 |
| | | | 210/184 |
| 2007/0007196 A1 | 1/2007 | Komatsu et al. | |
| 2007/0175387 A1 | 8/2007 | Kimura | |
| 2008/0121252 A1* | 5/2008 | Miya | B08B 3/10 |
| | | | 134/4 |
| 2009/0286178 A1 | 11/2009 | Muroi et al. | |
| 2010/0216183 A1* | 8/2010 | Okanojo | C12Q 1/24 |
| | | | 435/34 |
| 2011/0256041 A1 | 10/2011 | Ho et al. | |
| 2013/0255882 A1 | 10/2013 | Takahashi et al. | |
| 2014/0374352 A1 | 12/2014 | Brantley et al. | |
| 2015/0000517 A1 | 1/2015 | Yoshihara et al. | 95/1 |
| 2015/0020968 A1 | 1/2015 | Kimura | |
| 2015/0090340 A1 | 4/2015 | Takayanagi et al. | 137/1 |
| 2016/0026088 A1 | 1/2016 | Yamanaka et al. | |
| 2016/0256046 A1* | 9/2016 | Volker | A61B 1/125 |
| 2017/0160181 A1 | 6/2017 | Takahashi et al. | |
| 2018/0236510 A1* | 8/2018 | Osada | H01L 21/67017 |
| 2019/0131144 A1* | 5/2019 | Iwahata | H01L 21/6715 |

FOREIGN PATENT DOCUMENTS

| | | |
|---|---|---|
| JP | 3562910 B2 | 9/2004 |
| JP | 2004-330056 A | 11/2004 |
| JP | 2013-211525 A | 10/2013 |
| JP | 2015-072985 A | 4/2015 |
| KR | 10-0660676 B1 | 12/2006 |
| KR | 10-2007-0078811 A | 8/2007 |
| KR | 10-2008-0022226 A | 3/2008 |
| KR | 10-0841085 B1 | 6/2008 |
| KR | 10-2015-0126641 A | 11/2015 |
| TW | I334624 B | 12/2010 |
| TW | I538081 B | 6/2016 |

OTHER PUBLICATIONS

Notice of Reason for Refusal dated Oct. 21, 2019 in corresponding Korean Patent Application No. 10-2018-0078063 with English translation obtained from the JPO.

Notice of Decision to Grant dated Mar. 23, 2020 in corresponding Korean Patent Application No. 10-2018-0078063.

* cited by examiner

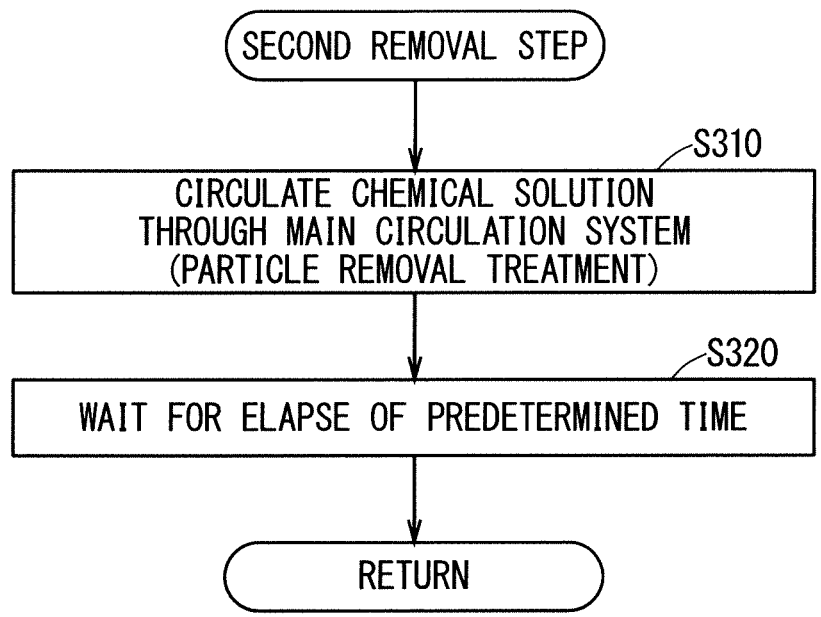

CHEMICAL SOLUTION FEEDER, SUBSTRATE TREATMENT APPARATUS, METHOD FOR FEEDING CHEMICAL SOLUTION, AND METHOD FOR TREATING SUBSTRATE

BACKGROUND OF THE INVENTION

Field of the Invention

The present invention relates to a chemical-solution feeding technique and a substrate treatment technique, for treating a substrate. Examples of a substrate to be treated include a substrate such as a semiconductor wafer, a glass substrate for a liquid crystal display device, a substrate for a plasma display, a substrate for an field emission display (FED), a substrate for an optical disk, a substrate for a magnetic disk, a substrate for a magneto-optical disk, a substrate for a photomask, a ceramic substrate, and a substrate for a solar battery.

Description of the Background Art

To reduce particles adhering to a substrate, there is known a technique for removing particles in a chemical solution by circulating the chemical solution to remove the particles with a filter provided in a circulation pipe line.

As such a technique, Japanese Patent Application Laid-Open No. 2015-072985 discloses a technique in which a part of a chemical solution having passed through a filter is discharged from a nozzle and the remaining chemical solution is returned to a primary side of the filter to filter again the returned remaining chemical solution and a chemical solution newly replenished from a supply source, with the filter during subsequent discharge operation.

In addition, Japanese Patent Application Laid-Open No. 2013-211525 discloses a technique for circulating a chemical solution in a circulation pipe line provided with a filter while a nozzle stops discharging the chemical solution.

As a device formed on a substrate becomes finer, particles to be removed become smaller in size. As a result, a pore diameter of a filter needs to be reduced. When the pore diameter of the filter becomes small, it becomes difficult for the chemical solution to fit in the filter (wettability of the filter is deteriorated). Thus, it is preferable to use a hydrophilic filter to suppress deterioration of wettability of the filter, thereby maintaining filtering efficiency.

The present inventors have found an experimental result illustrating that when a chemical solution at high temperature is filtered with a hydrophilic filter, use of the filter may cause increase of particles in a chemical solution. This problem also occurs when a chemical solution at high temperature is filtered with a filter while being circulated as in the technique disclosed in Japanese Patent Application Laid-Open No. 2015-072985 or Japanese Patent Application Laid-Open No. 2013-211525.

SUMMARY OF THE INVENTION

The present invention is directed to a chemical solution feeder for feeding a chemical solution to a predetermined feed target. This chemical solution feeder includes the following: a feed flow path that is connected at its one end to a supply source of the chemical solution at room temperature, and at its other end to the feed target, to guide the chemical solution to the feed target from the supply source; a first filter that is provided in the feed flow path to remove particles in the chemical solution at room temperature injected from the supply source to the feed flow path; a heating unit that heats the chemical solution in a portion of the feed flow path, closer to the feed target than the first filter; and a second filter that is provided in a portion of the feed flow path, closer to the feed target than the first filter, to remove particles in the chemical solution at high temperature, heated by the heating unit, flowing through the feed flow path toward the feed target; wherein the first filter is a hydrophilic filter and the second filter is a hydrophobic filter.

In this apparatus, the first filter is a hydrophilic filter capable of efficiently removing particles in a chemical solution at room temperature by filtering and chemically adsorbing the particles. The second filter is a hydrophobic filter that removes particles in a chemical solution by filtering the particles, so that even a chemical solution increased in temperature from room temperature to high temperature does not much deteriorate particle removing capability of the second filter. According to the present invention, the first filter having a high particle removing capability for a chemical solution at room temperature is capable of efficiently removing particles from a chemical solution at the room temperature, and the second filter having a particle removing capability with a small fluctuation caused by changes in temperature is capable of further removing particles remaining in the chemical solution after the chemical solution is heated to a high temperature. This enables the chemical solution at high temperature, from which the particles have been removed efficiently, to be fed.

The present invention is also directed to a method for feeding a chemical solution to a predetermined feed target. This method for feeding a chemical solution includes the following: a first removal step of removing particles in the chemical solution at room temperature injected into a feed flow path that is connected at its one end to a supply source for the chemical solution at room temperature, and at its other end to the feed target, and that guides the chemical solution to the feed target from the supply source, the particles being removed with a first filter provided in the feed flow path; a heating step of heating the chemical solution in a portion of the feed flow path, closer to the feed target than the first filter, with a heating unit; and a second removal step of removing particles in the chemical solution at high temperature, heated in the heating step, flowing through the feed flow path toward the feed target, with a second filter provided in a portion of the feed flow path, closer to the feed target than the first filter, wherein the first filter removes particles by filtering and chemically adsorbing the particles, and the second filter removes particles by filtering the particles, the second filter having a particle removing capability with less temperature dependence than the first filter.

According to this method, the first filter is capable of efficiently removing particles in a chemical solution at room temperature by filtering and chemically adsorbing the particles. The second filter removes particles by filtering the particles and has the particle removing capability with less temperature dependence than the first filter, so that even a chemical solution increased in temperature from room temperature to high temperature does not much deteriorate the particle removing capability of the second filter. According to the present invention, the first filter having a high particle removing capability for a chemical solution at room temperature is capable of efficiently removing particles from a chemical solution at the room temperature, and the second filter having a particle removing capability with a small fluctuation caused by changes in temperature is capable of further removing particles remaining in the chemical solution after the chemical solution is heated to a high temperature. This enables the chemical solution at high temperature, from which the particles have been removed efficiently, to be fed.

Thus, it is an object of the present invention to provide a technique capable of feeding a chemical solution at high temperature, from which particles have been removed efficiently.

These and other objects, features, aspects and advantages of the present invention will become more apparent from the following detailed description of the present invention when taken in conjunction with the accompanying drawings.

BRIEF DESCRIPTION OF THE DRAWING

FIGS. 7 to 10 are flowcharts each illustrating an example of operation of the chemical solution feeder according to the first preferred embodiment of the present invention.

DESCRIPTION OF THE PREFERRED EMBODIMENTS

Figure 1:
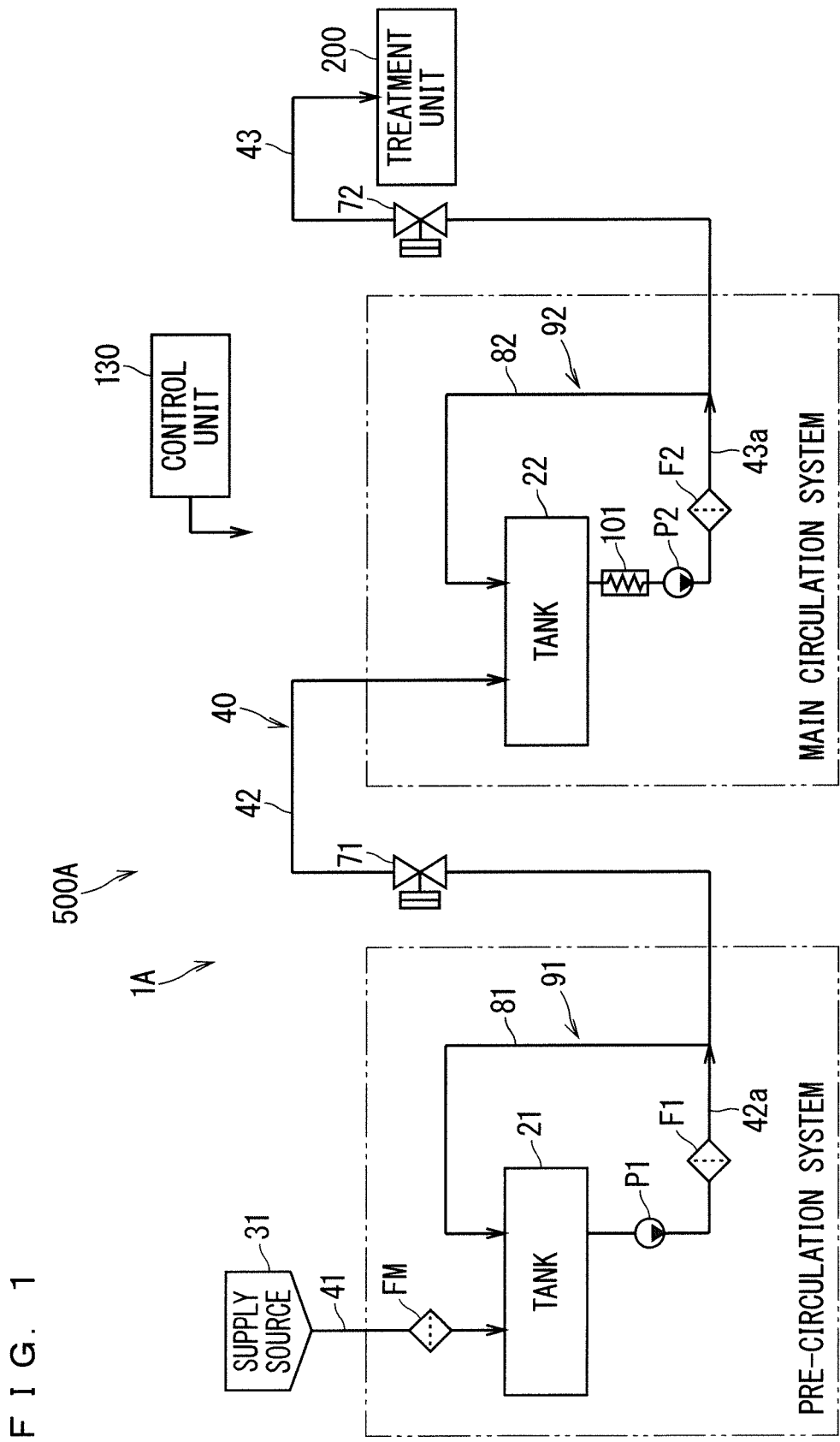
FIG. 1 is a schematic diagram illustrating a schematic configuration of a substrate treatment apparatus including a chemical solution feeder according to a first preferred embodiment of the present invention.

Preferred embodiments of the present invention will be described below with reference to the drawings. The following preferred embodiments each are an example embodying the present invention and are not a case of limiting the technical scope of the present invention. In each of the drawings, the same reference numeral is assigned to a part having a similar configuration and function, and duplicated description is eliminated in the following description. Each of the drawings is illustrated schematically.

1. First Preferred Embodiment

<1-1. General Configuration of Substrate Treatment Apparatus 500A>

Figure 6:
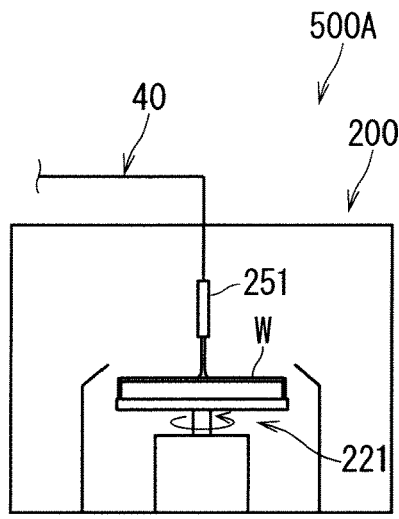
FIG. 6 is a schematic diagram illustrating a schematic configuration of a treatment unit provided in the substrate treatment apparatus of FIG. 1.

The configuration of a substrate treatment apparatus 500A will be described with reference to FIGS. 1 and 6. FIG. 1 is a schematic diagram illustrating a schematic configuration of the substrate treatment apparatus 500A provided with a chemical solution feeder 1A according to a first preferred embodiment. FIG. 6 is a schematic diagram illustrating a schematic configuration of a treatment unit ("feed target") 200 provided in the substrate treatment apparatus 500A. Substrate treatment apparatuses 500B to 500E according to the respective second to fifth preferred embodiments, described below, also each include a treatment unit 200.

The substrate treatment apparatus 500A includes the chemical solution feeder 1A and the treatment unit 200. The chemical solution feeder 1A feeds a chemical solution at a higher temperature (e.g., 40° C. to 80° C.) than a room temperature (e.g., 20° C. to 25° C.) to the treatment unit 200 being a feed target of the chemical solution. The treatment unit 200 applies treatment to a substrate W using the high-temperature chemical solution fed from the chemical solution feeder 1A.

<Treatment Unit 200>

The treatment unit 200 rotates the substrate W around a predetermined rotation axis while holding the substrate W from below with the spin chuck 221. A nozzle 251 is disposed above the substrate W, and the chemical solution feeder 1A feeds a chemical solution through a feed flow path (also referred to as a "feed system" or "chemical solution feed system") 40. The nozzle 251 discharges the fed chemical solution onto the main surface of the substrate W being rotated by the spin chuck 221. The main surface of the substrate W is treated with the chemical solution.

The substrate W has a substantially circular surface shape. The substrate W is transferred into and from the treatment unit 200 by a robot or the like with the nozzle 251 disposed at a retracted position by a predetermined moving mechanism. The substrate W transferred into the treatment unit 200 is detachably held by the spin chuck 221.

As the treatment unit 200, a batch type treatment unit may be used, the batch type treatment unit being configured such that a chemical solution fed from the chemical solution feeder 1A is stored in a treatment tank, and a plurality of substrates W batch-assembled are immersed in the stored chemical solution to be treated collectively using the chemical solution.

<Configuration of Chemical Solution Feeder 1A>

The chemical solution feeder 1A feeds a chemical solution at high temperature with a small particle content to the treatment unit 200. The chemical solution feeder 1A includes a feed flow path 40, a filter ("first filter") F1, a heater ("heating unit") 101, and a filter ("second filter") F2.

The chemical solution feeder 1A further includes a control unit 130. The heater 101, and pumps P1 and P2, and valves 71 and 72, being described below, are electrically connected to the control unit 130, and operate in accordance with control by the control unit 130. As the control unit 130, a device similar to a general computer can be used, for example. Specifically, the control unit 130 includes a CPU that performs various computation processes, a ROM or read-only memory for storing a basic program therein, a RAM or readable/writable memory for storing various pieces of information therein, and a magnetic disk for storing control software, data, and the like therein, for example. In the control unit 130, the CPU as a main control unit performs calculation processing according to a procedure described in the program to control each unit of the chemical solution feeder 1A.

The feed flow path 40 is connected at its one end to a supply source ("chemical solution supply source") 31 for feeding a chemical solution at room temperature. The supply source 31 stores the chemical solution at room temperature, and a pump or the like (not illustrated) feeds the chemical solution to the feed flow path 40. The feed flow path 40 is connected at its other end to the treatment unit 200. The feed flow path 40 guides the chemical solution fed from the supply source 31 to the treatment unit 200. Operation of the supply source 31 is controlled by the control unit 130, for example.

In the feed flow path 40, the filters F1 and F2 are provided in this order from a supply source 31 side toward a treatment unit 200, or along a flowing direction of the chemical solution in the feed flow path 40. The supply source 31 side is an upstream side in the flowing direction of the chemical solution and the treatment unit 200 side is a downstream side in the flowing direction of the chemical solution.

The feed flow path 40 (more specifically, a pipe 43 described below) is also provided with the heater 101. The filter F1 and the heater 101 are also provided in the feed flow path 40 in this order along the flowing direction of the chemical solution. The heater 101 heats the chemical solution having passed through the filter F1. When passing through the filter F2, the chemical solution heated to a high temperature by the heater 101 is filtered by the filter F2, and then particles are removed.

The feed flow path 40 includes a pipe 41 communicatively connected at its one end to the supply source 31, a tank 21 communicatively connected to the other end of the pipe 41, a pipe 42 communicatively connected at its one end to the tank 21, a tank 22 communicatively connected to the other end of the pipe 42, and a pipe 43 communicatively connected at its one end to the tank 22 and at its other end to the treatment unit 200.

At some midpoint in the pipe 41, a metal removal filter FM capable of removing a predetermined metal contained in the chemical solution is provided. When the chemical solution injected from the supply source 31 into the pipe 41 passes through the metal removal filter FM, the predetermined metal contained therein is removed, and then flows into the tank 21 to be temporarily stored in the tank 21.

The valve 71 is provided at some midpoint in the pipe 42, and is capable of opening and closing the flow path of the pipe 42 in accordance with control of the control unit 130.

The feed flow path 40 further includes a return pipe 81 branching from the pipe 42. The pipe 42 is a portion of the feed flow path 40, the portion being closer to the treatment unit 200 than the tank 21 and closer to the supply source 31 than the heater 101 in the feed flow path 40. More specifically, the return pipe 81 branches from a portion of the pipe 42, closer to the supply source 31 than the valve 71.

The return pipe 81 branching from the pipe 42 is connected to the feed flow path 40 again at a position closer to the supply source 31 than the branching portion. In the example of FIG. 1, the return pipe 81 is connected to the tank 21.

An annular circulation flow path ("circulation pipe line") 91 is formed by a part of the feed flow path 40, namely a partial pipe 42a in the pipe 42, from the tank 21 to the branching portion of the return pipe 81 (the branching portion on the treatment unit 200 side), the return pipe 81, and the tank 21. The valve 71 is capable of opening and closing a flow path formed by a portion of the feed flow path 40, closer to the treatment unit 200 than the circulation flow path 91, at a position closer to the supply source 31 than the heater 101.

In the chemical solution feeder 1A, while the filter F1 is preferably provided in the partial pipe 42a, it may be provided in the return pipe 81. That is, the filter F1 is provided in the circulation flow path 91. The partial pipe 42a is also provided with the pump P1. The pump P1 is driven by control of the control unit 130 to feed a chemical solution from the tank 21 to the tank 22.

The filter F1 filters a chemical solution at room temperature injected from the supply source 31 into the feed flow path 40 to remove particles in the chemical solution. The filter F1 filters out particles with its pores and chemically adsorbs particles to remove the particles in the chemical solution. As the filter F1, there is used a hydrophilic filter acquired by applying hydrophilic treatment to a resin having pores increasing wettability of a filter, for example.

When the pump P1 is driven, with the valve 71 closed, a chemical solution at room temperature flows from the tank 21 toward the treatment unit 200 along the partial pipe 42a. Then, the chemical solution flows from the branching portion of the return pipe 81 into the return pipe 81 to flow through the return pipe 81 toward the tank 21, and returns to the tank 21 again from the return pipe 81 to circulate through the circulation flow path 91.

During circulation of the chemical solution in the circulation flow path 91, particles in the chemical solution at room temperature are filtered out by the pores of the filter F1 and are chemically adsorbed to be efficiently removed. The amount of particles in the chemical solution decreases as time elapses. The circulation flow path 91, the pump P1, and the filter F1 constitute a pre-circulation system in which particles in a chemical solution are reduced while the chemical solution is circulated at room temperature.

The control unit 130 caused the valve 71 to open when a predetermined time has elapsed after a start of circulation of the chemical solution in the circulation flow path 91, for example. When the pump P1 is driven, with the valve 71 opened, the chemical solution at room temperature with particles having decreased flows into the tank 22 through the pipe 42 to be temporarily stored in the tank 22.

The valve 72 is provided at some midpoint in the pipe 43 connected to the tank 22, and is capable of opening and closing the flow path of the pipe 43 in accordance with control of the control unit 130. The heater 101 and the filter F2 are provided in a portion of the pipe 43, closer to the supply source 31 than the valve 72. The heater 101 is provided on the outer peripheral surface of the pipe 43 so as to surround the pipe 43, for example. The heater 101 heats the chemical solution at room temperature, having passed through the filter F1. The chemical solution heated to a high temperature by the heater 101 is filtered by the filter F2 when passing through the filter F2.

The feed flow path 40 further includes a return pipe 82 for a chemical solution at high temperature, branching from the pipe 43. The return pipe 82 is branched from a portion of the feed flow path 40, closer to the treatment unit 200 than the heater 101 and closer to the supply source 31 than the valve 72, and is connected to the feed flow path 40 again at a position closer to the supply source 31 than the branching portion. In the example of FIG. 1, the return pipe 82 is connected to the tank 22. An annular circulation flow path ("circulation pipe line") 92 for a chemical solution at high temperature is formed by a partial pipe 43a in the pipe 43, from the tank 22 to the branching portion of the return pipe 82 (the branching portion on the treatment unit 200 side), the return pipe 82, and the tank 22. In the chemical solution feeder 1A, while the filter F2 is preferably provided in the partial pipe 43a, it may be provided in the return pipe 82. That is, the filter F2 is provided in the circulation flow path 92. The heater 101 is also provided in the circulation flow path 92. The heater 101 is preferably provided closer to the supply source 31 than the filter F2 in the partial pipe 43a. The partial pipe 43a is also provided with the pump P2. The pump P2 is driven by control of the control unit 130 to feed a chemical solution from the tank 22 toward the treatment unit 200. In the example of FIG. 1, while the tank 22, the heater 101, and the filter F2 are provided in this order along a flowing direction of the chemical solution in the circulation flow path 92, the tank 22, the filter F2, and the heater 101 may be provided in this order along the flowing direction of the chemical solution in the circulation flow path 92.

The filter F2 filters a chemical solution heated to a high temperature by the heater 101, flowing through the feed flow path 40 toward the treatment unit 200, to remove particles in the chemical solution. The filter F2 filters out particles with its pores to remove the particles in the chemical solution. As the filter F2, a hydrophobic filter is used, for example.

For example, a hydrophilic filter also removes particles in a chemical solution by chemically adsorbing the particles. For this reason, it is conceivable that when the chemical solution changes in temperature from a room temperature to a high temperature, the hydrophilic filter may release particles held by adsorption to become a source of particles. In addition, it is known that a hydrophilic filter is contaminated during hydrophilic treatment to cause its cleanliness to be lower than that of a hydrophobic film. Thus, it is also conceivable that when the chemical solution is heated from the room temperature to the high temperature, the hydrophilic filter itself discharges contaminants rather than that the adsorbed particles are released. The above two possibilities each are conceivable as a cause of the fact that particles in a chemical solution may increase when the chemical solution at high temperature is filtered with a hydrophilic filter, for example.

In contrast, a hydrophobic filter generally does not have propertied as described above, so that its particle removing capability is less likely to vary largely even for a chemical solution changed in temperature from a room temperature to a high temperature, for example. In other words, the filter F2 generally tends to have less temperature dependence of particle removing capability than the filter F1. Thus, the filter F2 is less likely to become a source of particles when filtering a chemical solution at high temperature, as compared with the filter F1.

As the filter F2, there may be used a high-temperature-compatible filter subjected to surface treatment other than the hydrophilic treatment, having particle removing capability for a chemical solution at high temperature, being substantially equal to particle removing capability for a chemical solution at room temperature.

The filter F1 preferably has a pore diameter set smaller than that of the filter F2. This enables the filter F1 to be improved in removing capability to remove particles in the chemical solution at room temperature. The filter F1 has a pore diameter of 7 nm or less, for example, and the filter F2 has a pore diameter of 10 nm or more, for example. Resin or the like as a material of the filter F1 may be the same as or different from resin or the like as a material of the filter F2.

When the pump P2 is driven, with the valve 72 closed, a chemical solution in the tank 22 flows from the tank 22 toward the treatment unit 200 along the partial pipe 43a. Then, the chemical solution flows from the branching portion of the return pipe 82 into the return pipe 82 to flow through the return pipe 82 toward the tank 22, and returns to the tank 22 again from the return pipe 82 to circulate through the circulation flow path 92.

During circulation of the chemical solution through the circulation flow path 92, the chemical solution is heated by the heater 101 to have a high temperature, and passes through the filter F2. At that time, particles in the chemical solution at high temperature are filtered out by the pores of the filter F2 to be removed. The filter F2 has less temperature dependency of the capability to remove particles than the filter F1, so that particles can be efficiently removed from the chemical solution for even a chemical solution at high temperature. The amount of particles in the chemical solution decreases as time elapses. The circulation flow path 92, the heater 101, the pump P2, and the filter F2 constitute a main circulation system in which particles in a chemical solution are reduced while the chemical solution at high temperature is circulated.

The control unit 130 caused the valve 72 to open when a predetermined time has elapsed after a start of circulation of the chemical solution in the circulation flow path 92, for example. When the pump P2 is driven, with the valve 72 opened, the chemical solution at high temperature with particles having decreased is fed to the treatment unit 200 through the valve 72 and is applied to a substrate W from the nozzle 251 of the treatment unit 200.

<1-2. Operation of Chemical Solution Feeder 1A>

Figure 7:
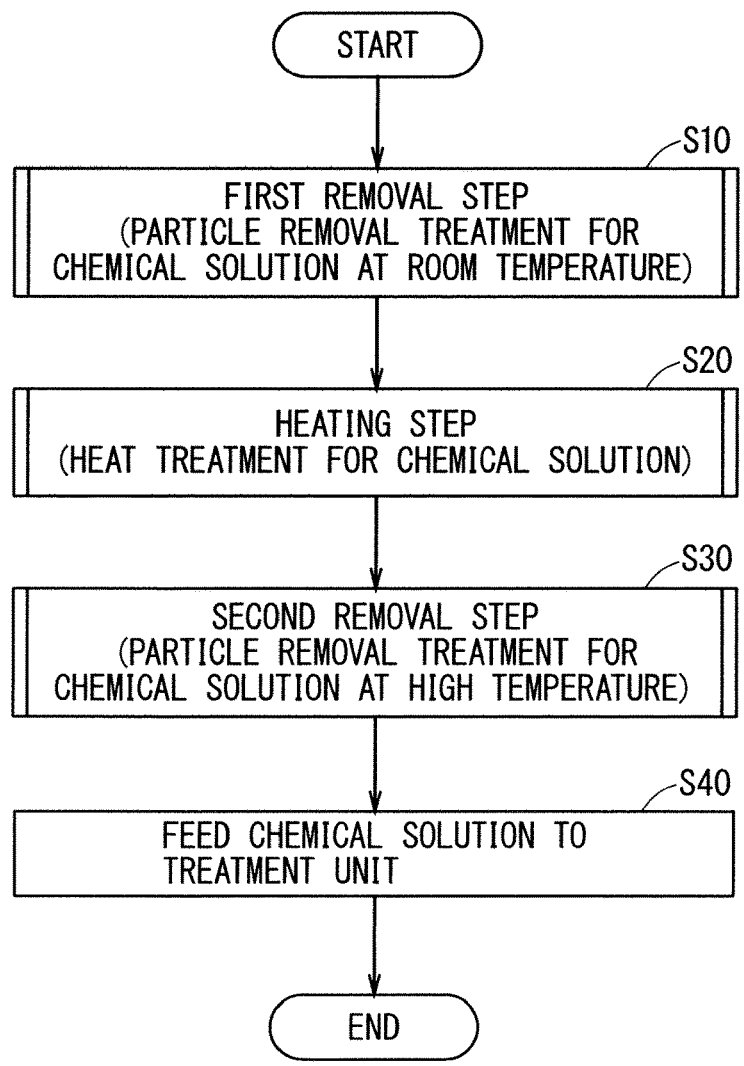

Next, an example of operation of the chemical solution feeder 1A will be described. FIGS. 7 to 10 each are a flowchart illustrating an example of the operation of the chemical solution feeder 1A. FIG. 7 schematically illustrates general operation of the chemical solution feeder 1A.

As illustrated in FIG. 7, the chemical solution feeder 1A performs a particle removal treatment ("first removal step") for removing particles in a chemical solution at room temperature in step S10. The first removal step is a step in which the chemical solution feeder 1A removes particles in a chemical solution at room temperature injected from the supply source 31 into the feed flow path 40 with the filter F1.

In step S20, the chemical solution feeder 1A applies a heat treatment ("heating step") to the chemical solution at room temperature, from which particles have been removed in the first removal step. The heating step is a step in which the chemical solution feeder 1A heats the chemical solution having passed through the filter F1 by using the heater 101 provided in a portion of the feed flow path 40, closer to the treatment unit 200 than the filter F1.

In step S30, the chemical solution feeder 1A performs a particle removal treatment ("second removal step") for removing particles in the chemical solution heated to a high temperature in the heating step. The second removal step is a step in which the chemical solution feeder 1A removes particles in the chemical solution at high temperature heated in the heating step, flowing through the feed flow path 40 toward the treatment unit 200, with the filter F2.

In step S40, the chemical solution feeder 1A feeds the chemical solution at high temperature from which the particles have been removed in the second removal step to the treatment unit 200 so that treatment using the chemical solution is applied to a substrate W.

Figure 8:
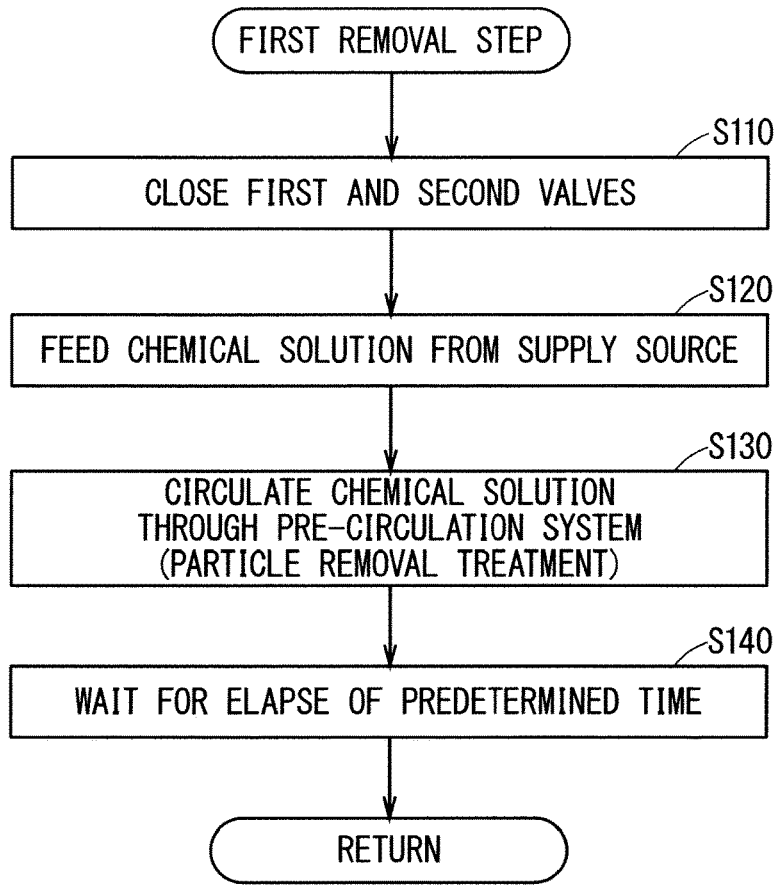

FIG. 8 is a flowchart illustrating an example of operation when the chemical solution feeder 1A performs the first removal step in step S10 in FIG. 7. In the example of FIG. 8, the chemical solution feeder 1A removes particles in a chemical solution with the filter F1 provided in the circulation flow path 91 in the first removal step while circulating the chemical solution at room temperature along the annular circulation flow path 91.

When starting the first removal step, the chemical solution feeder 1A closes the valve ("first valve") 71 and the valve ("second valve") 72 in step S110, as illustrated in FIG. 8.

In step S120, the chemical solution feeder 1A receives a chemical solution at room temperature fed from the supply source 31. The chemical solution is injected from the supply source 31 to the pipe 41, and is fed to the tank 21 through the pipe 41. During passing through the pipe 41, the chemical solution passes through the metal removal filter FM to be filtered with the metal removal filter FM, so that a predetermined metal is removed. Then, the chemical solution is fed to the tank 21.

In step S130, the chemical solution feeder 1A performs a particle removal treatment on the chemical solution at room temperature. Specifically, the chemical solution feeder 1A circulates the chemical solution at the room temperature stored in the tank 21 in the pre-circulation system (circulation flow path 91) by driving the pump P1. As a result, when the chemical solution at room temperature passes through the filter F1, particles in the chemical solution are repeatedly removed with the filter F1, and the particles in the chemical solution decrease as time elapses.

In step S140, the control unit 130 of the chemical solution feeder 1A waits until a predetermined time elapses. The predetermined time is a time during which the amount of particles in the chemical solution at room temperature circulating in the circulation flow path 91 becomes equal to or less than a predetermined reference value, for example, and is stored in the magnetic disk or the like of the control unit 130 by being obtained in advance by experiment or the like. Passing through step S140, the chemical solution at room temperature has the amount (concentration) of particles, equal to or less than the predetermined reference value. The chemical solution feeder 1A finishes the operation of FIG. 8 to shift the processing to step S20 in FIG. 7.

Figure 9:
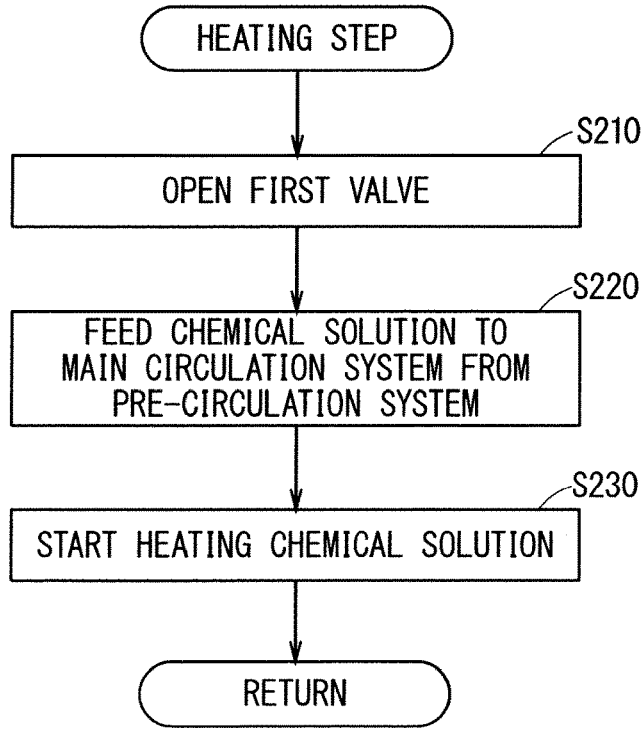

FIG. 9 is a flowchart illustrating an example of operation when the chemical solution feeder 1A performs the heating step in step S20 in FIG. 7.

When starting the heating step, the chemical solution feeder 1A opens the valve 71 in step S210, as illustrated in FIG. 9.

In step S220, the chemical solution feeder 1A feeds a chemical solution from the pre-circulation system to the main circulation system including the circulation flow path 92, the heater 101, the pump P2, and the filter F2. When the chemical solution feeder 1A opens the valve 71, with the pump P2 driven, the chemical solution is fed to the tank 22 to be stored therein, and then is injected from the tank 22 to the pipe 43.

In step S230, the chemical solution feeder 1A starts heating the chemical solution in the main circulation system. The chemical solution feeder 1A starts heating the chemical solution in the pipe 43 by energizing the heater 101 to cause the heater 101 to generate heat. The chemical solution feeder 1A finishes the operation of FIG. 9 to shift the processing to step S30 in FIG. 7.

FIG. 10 is a flowchart illustrating an example of operation when the chemical solution feeder 1A performs the second removal step in step S30 in FIG. 7.

When starting the second removal step, the chemical solution feeder 1A starts circulation of the chemical solution in the main circulation system by driving the pump P2 in step S310, as illustrated in FIG. 10. As a result, the chemical solution circulates through the circulation flow path 92 while being heated by the heater 101, and then particles are removed with the filter F2.

In step S320, the control unit 130 of the chemical solution feeder 1A waits until a predetermined time elapses. The predetermined time is a time during which the amount of particles in the chemical solution at room temperature circulating in the circulation flow path 92 becomes equal to or less than a predetermined reference value and the chemical solution reaches a predetermined high temperature, for example, and is stored in the magnetic disk or the like of the control unit 130 by being obtained in advance by experiment or the like. Passing through step S320, the chemical solution has the amount (concentration) of particles, equal to or less than the predetermined reference value, and has the predetermined high temperature. The chemical solution feeder 1A finishes the operation of FIG. 10 to shift the processing to step S40 in FIG. 7. The chemical solution at high temperature is fed to the treatment unit 200 in step S40 and used for treatment of a substrate W.

2. Second Preferred Embodiment

<2-1. General Configuration of Substrate Treatment Apparatus 500B>

Figure 2:
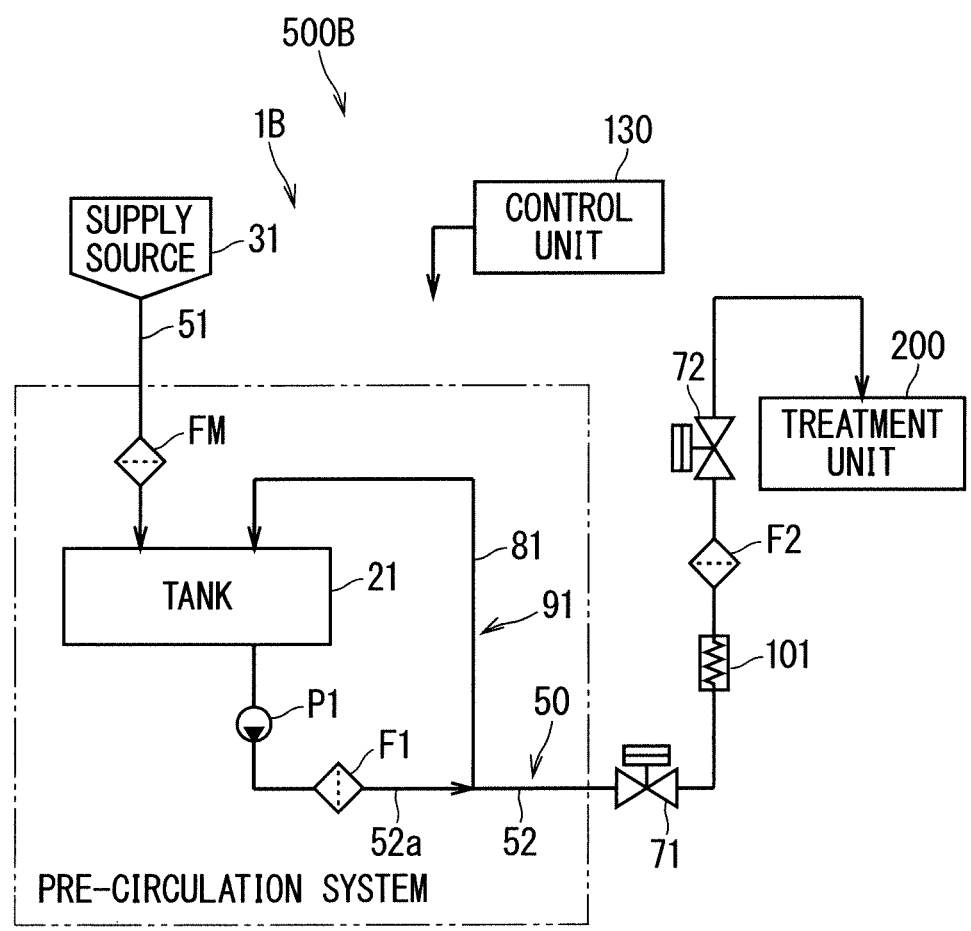
FIG. 2 is a schematic diagram illustrating a schematic configuration of a substrate treatment apparatus including a chemical solution feeder according to a second preferred embodiment of the present invention.

The configuration of a substrate treatment apparatus 500B will be described with reference to FIG. 2. FIG. 2 is a schematic diagram illustrating a schematic configuration of a substrate treatment apparatus 500B provided with a chemical solution feeder 1B according to a second preferred embodiment.

The substrate treatment apparatus 500B includes the chemical solution feeder 1B and the treatment unit 200. The chemical solution feeder 1B feeds a chemical solution at a higher temperature than a room temperature to the treatment unit 200 being a feed target of the chemical solution.

<Configuration of Chemical Solution Feeder 1B>

The chemical solution feeder 1B feeds a chemical solution at high temperature with a small particle content to the treatment unit 200. The chemical solution feeder 1B includes a feed flow path (also referred to as a "feed system" or "chemical solution feed system") 50, and also includes a filter F1, a heater 101, a filter F2, and a control unit 130, as with the chemical solution feeder 1A of the first preferred embodiment.

The feed flow path 50 is connected at its one end to a supply source 31 for feeding a chemical solution at room temperature. The feed flow path 50 is connected at its other end to the treatment unit 200. The feed flow path 50 guides the chemical solution fed from the supply source 31 to the treatment unit 200.

The feed flow path 50 includes a pipe 51 communicatively connected at its one end to the supply source 31, a tank 21 communicatively connected to the other end of the pipe 51, and a pipe 52 communicatively connected at its one end to the tank 21 and at its other end to the treatment unit 200.

In the feed flow path 50 (pipe 52), the filter F1, the heater 101, and the filter F2 are provided in this order from a supply source 31 side toward a treatment unit 200, or along a flowing direction of the chemical solution in the feed flow path 50.

At some midpoint in the pipe 51, a metal removal filter FM capable of removing a predetermined metal contained in the chemical solution is provided. When the chemical solution injected from the supply source 31 into the pipe 51 passes through the metal removal filter FM, the predetermined metal contained therein is removed, and then flows into the tank 21 to be temporarily stored in the tank 21.

At some midpoint in the pipe 52, there is provided a valve 71 capable of opening and closing the flow path of the pipe 52 in accordance with control of the control unit 130.

The feed flow path 50 further includes a return pipe 81 branching from the pipe 52. The pipe 52 is a portion of the feed flow path 50, extending from the tank 21 to the treatment unit 200. More specifically, the return pipe 81 branches from a portion of the pipe 52, closer to the supply source 31 than the valve 71.

The return pipe 81 branching from the pipe 52 is connected to the feed flow path 50 again at a position closer to the supply source 31 than the branching portion. In the example of FIG. 2, the return pipe 81 is connected to the tank 21.

An annular circulation flow path 91 is formed by a part of the feed flow path 50, namely a partial pipe 52a in the pipe 52, from the tank 21 to the branching portion of the return pipe 81 (the branching portion on the treatment unit 200 side), the return pipe 81, and the tank 21. The valve 71 is capable of opening and closing a flow path formed by a portion of the feed flow path 50, closer to the treatment unit 200 than the circulation flow path 91, at a position closer to the supply source 31 than the heater 101.

While the filter F1 is preferably provided in the partial pipe 52a, it may be provided in the return pipe 81. That is, the filter F1 is provided in the circulation flow path 91. The partial pipe 52a is also provided with a pump P1. The pump P1 is driven by control of the control unit 130 to feed a chemical solution from the tank 21 to the treatment unit 200.

The filter F1 filters a chemical solution at room temperature injected from the supply source 31 into the feed flow path 50 to remove particles in the chemical solution.

When the pump P1 is driven, with the valve 71 closed, a chemical solution at room temperature flows from the tank 21 toward the treatment unit 200 along the partial pipe 52a. Then, the chemical solution flows from the branching portion of the return pipe 81 into the return pipe 81 to flow through the return pipe 81 toward the tank 21, and returns to the tank 21 again from the return pipe 81 to circulate through the circulation flow path 91.

During circulation of the chemical solution in the circulation flow path 91, particles in the chemical solution at room temperature are filtered out by the pores of the filter F1 and are chemically adsorbed to be efficiently removed. The amount of particles in the chemical solution decreases as time elapses. The circulation flow path 91, the pump P1, and the filter F1 constitute a pre-circulation system as with the pre-circulation system in the chemical solution feeder 1A, and particles in a chemical solution are reduced while the chemical solution is circulated at room temperature.

The control unit 130 caused the valve 71 to open when a predetermined time has elapsed after a start of circulation of the chemical solution in the circulation flow path 91, for example.

The heater 101 and the filter F2 are provided in a portion of the pipe 52, closer to the treatment unit 200 than the circulation flow path 91, and more accurately closer to the treatment unit 200 than the valve 71. The heater 101 is provided on the outer peripheral surface of the pipe 52 so as to surround the pipe 52, for example. In a portion of the pipe 52, closer of the treatment unit 200 than the filter F2, there is provided a valve 72 capable of opening and closing a flow path of a pipe 43 in accordance with control of the control unit 130. The heater 101 heats the chemical solution at room temperature, having passed through the filter F1. The chemical solution heated to a high temperature by the heater 101 is filtered by the filter F2 when passing through the filter F2.

The filter F2 filters a chemical solution heated to a high temperature by the heater 101, flowing through the feed flow path 50 toward the treatment unit 200, to remove particles in the chemical solution. The filter F2 filters out particles with its pores to remove the particles in the chemical solution.

The chemical solution is heated by the heater 101 to have a high temperature, and passes through the filter F2. At that time, particles in the chemical solution at high temperature are filtered out by the pores of the filter F2 to be removed.

The filter F2 has less temperature dependency of the capability to remove particles than the filter F1, so that particles can be efficiently removed from the chemical solution for even a chemical solution at high temperature. Unlike the chemical solution feeder 1A, the chemical solution feeder 1B does not have a main circulation system that reduces particles in a chemical solution while circulating the chemical solution at a high temperature.

When the control unit 130 causes the valve 72 to open, the chemical solution at high temperature, containing particles having decreased, is fed to the treatment unit 200 through the valve 72 by liquid-feeding operation of the pump P2, and then is applied to a substrate W from a nozzle 251 of the treatment unit 200.

<2-2. Operation of Chemical Solution Feeder 1B>

Next, an example of operation of the chemical solution feeder 1B will be described. As with the chemical solution feeder 1A, the chemical solution feeder 1B performs the operation illustrated in FIG. 7.

As illustrated in FIG. 7, the chemical solution feeder 1B performs a particle removal treatment ("first removal step") for removing particles in a chemical solution at room temperature in step S10. The first removal step is a step in which the chemical solution feeder 1B removes particles in a chemical solution at room temperature injected from the supply source 31 into the feed flow path 50 with the filter F1.

As with the chemical solution feeder 1A, the chemical solution feeder 1B removes particles in a chemical solution with the filter F1 provided in the circulation flow path 91 in the first removal step while circulating the chemical solution at room temperature along the annular circulation flow path 91. The specific operation of the chemical solution feeder 1B in the first removal step can be described by replacing the feed flow path 40 and the pipe 41 with the feed flow path 50 and the pipe 51, respectively, in the first removal step of the chemical solution feeder 1A described above with reference to FIG. 8.

In step S20 in FIG. 7, the chemical solution feeder 1B applies a heat treatment ("heating step") to the chemical solution at room temperature, from which particles have been removed in the first removal step. The heating step is a step in which the chemical solution feeder 1B heats the chemical solution having passed through the filter F1 by using the heater 101 provided in a portion of the feed flow path 50, closer to the treatment unit 200 than the filter F1.

In the heating step, the chemical solution feeder 1B opens the valve 71, and feeds the chemical solution to a portion of the pipe 52, including the heater 101 and the filter F2. The chemical solution feeder 1B starts heating the chemical solution in the pipe 52 by energizing the heater 101 to cause the heater 101 to generate heat.

In step S30 in FIG. 7, the chemical solution feeder 1B performs a particle removal treatment ("second removal step") for removing particles in the chemical solution heated to a high temperature in the heating step. The second removal step is a step in which the chemical solution feeder 1B removes particles in the chemical solution at high temperature heated in the heating step, flowing through the feed flow path 50 toward the treatment unit 200, with the filter F2.

The chemical solution feeder 1B opens the valve 72, and feeds the chemical solution to the treatment unit 200 side using feeding operation of the pump P1. The chemical solution is heated by the heater 101 to have a high temperature, and then passes through the filter F2. The filter F2 removes particles by filtering the chemical solution at high temperature.

In step S40 in FIG. 7, the chemical solution feeder 1B feeds the chemical solution at high temperature, from which the particles have been removed in the second removal step, to the treatment unit 200 so that treatment using the chemical solution is applied to a substrate W.

3. Third Preferred Embodiment

<3-1. General Configuration of Substrate Treatment Apparatus 500C>

Figure 3:
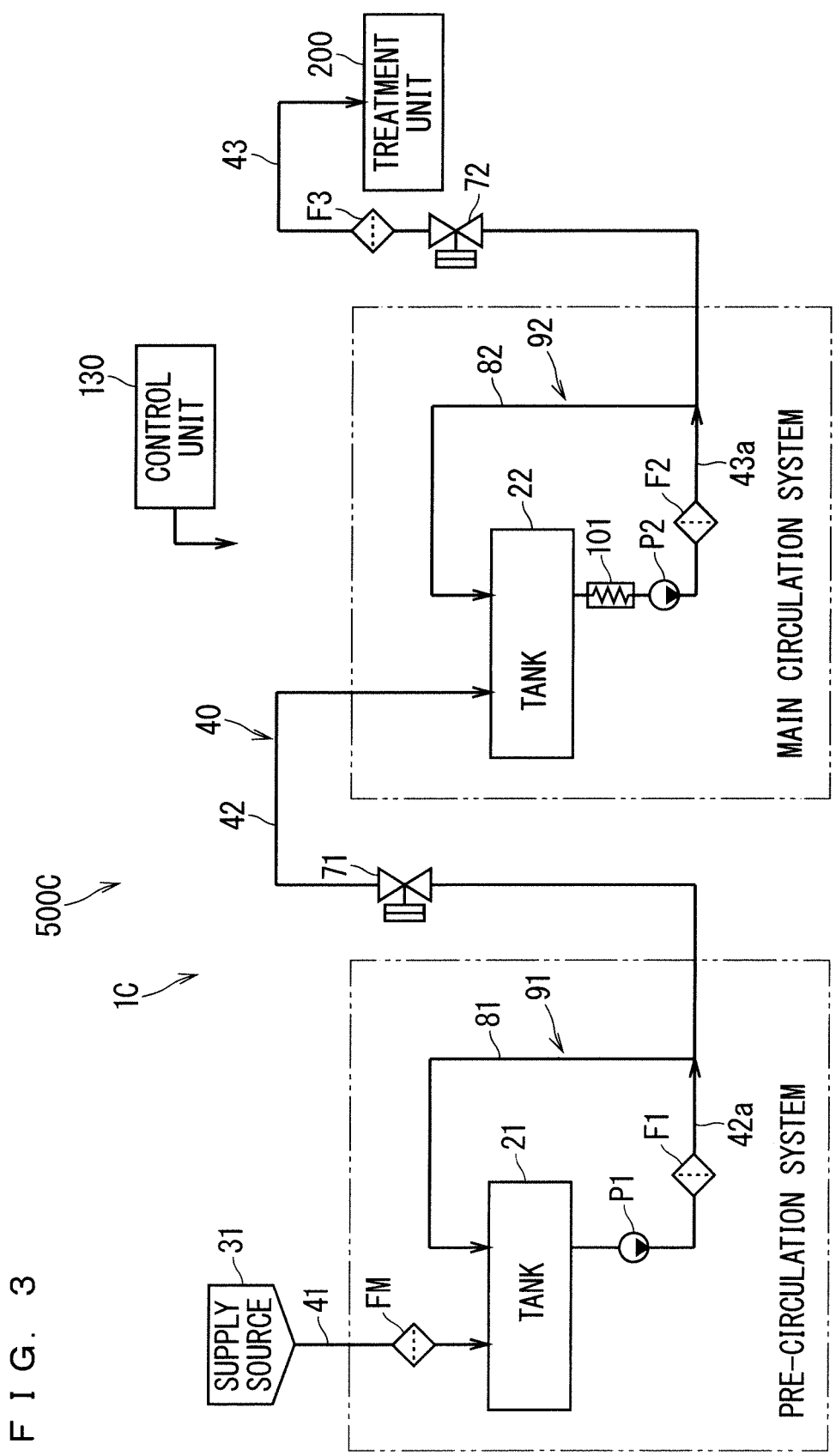
FIG. 3 is a schematic diagram illustrating a schematic configuration of a substrate treatment apparatus provided with a chemical solution feeder according to a third preferred embodiment of the present invention.

The configuration of a substrate treatment apparatus 500C will be described with reference to FIG. 3. FIG. 3 is a schematic diagram illustrating a schematic configuration of the substrate treatment apparatus 500C including a chemical solution feeder 1C according to a third preferred embodiment.

The substrate treatment apparatus 500C includes the chemical solution feeder 1C and a treatment unit 200. The chemical solution feeder 1C feeds a chemical solution at a higher temperature than a room temperature to the treatment unit 200 being a feed target of the chemical solution. The substrate treatment apparatus 500C has a configuration similar to the substrate treatment apparatus 500A, except that the chemical solution feeder 1C is provided instead of the chemical solution feeder 1A.

<Configuration of Chemical Solution Feeder 1C>

The chemical solution feeder 1C feeds a chemical solution at high temperature with a small particle content to the treatment unit 200. The chemical solution feeder 1C includes a feed flow path 40, a filter F1, a heater 101, and a filter F2, and further includes a control unit 130. The chemical solution feeder 1C is configured similarly to the chemical solution feeder 1A, except that a filter F3 is further provided closer to the treatment unit 200 than the valve 72 in the pipe 43. In the example of FIG. 3, while the tank 22, the heater 101, and the filter F2 are provided in this order along a flowing direction of the chemical solution in the circulation flow path 92, the tank 22, the filter F2, and the heater 101 may be provided in this order along the flowing direction of the chemical solution in the circulation flow path 92.

The filter F3 further filters the chemical solution at high temperature, having passed through the filter F2, to remove particles in the chemical solution. As with the filter F2, the filter F3 filters out particles with its pores to remove the particles in the chemical solution. The filter F3 has less temperature dependence of particle removing capability than the filter F1. As the filter F3, a hydrophobic filter is used as with the filter F2, for example. The filter F3 has a pore diameter set similar to that of the filter F2.

<3-2. Operation of Chemical Solution Feeder 1C>

The chemical solution feeder 1C is configured similarly to the chemical solution feeder 1A, except that the filter F3 is further provided. Thus, the chemical solution feeder 1C operates similarly to the chemical solution feeder 1A, except that particles in a chemical solution at high temperature are removed with the filter F3 after the second removal step by the filter F2, and then the chemical solution is fed to the treatment unit 200.

4. Fourth Preferred Embodiment

<4-1. General Configuration of Substrate Treatment Apparatus 500D>

Figure 4:
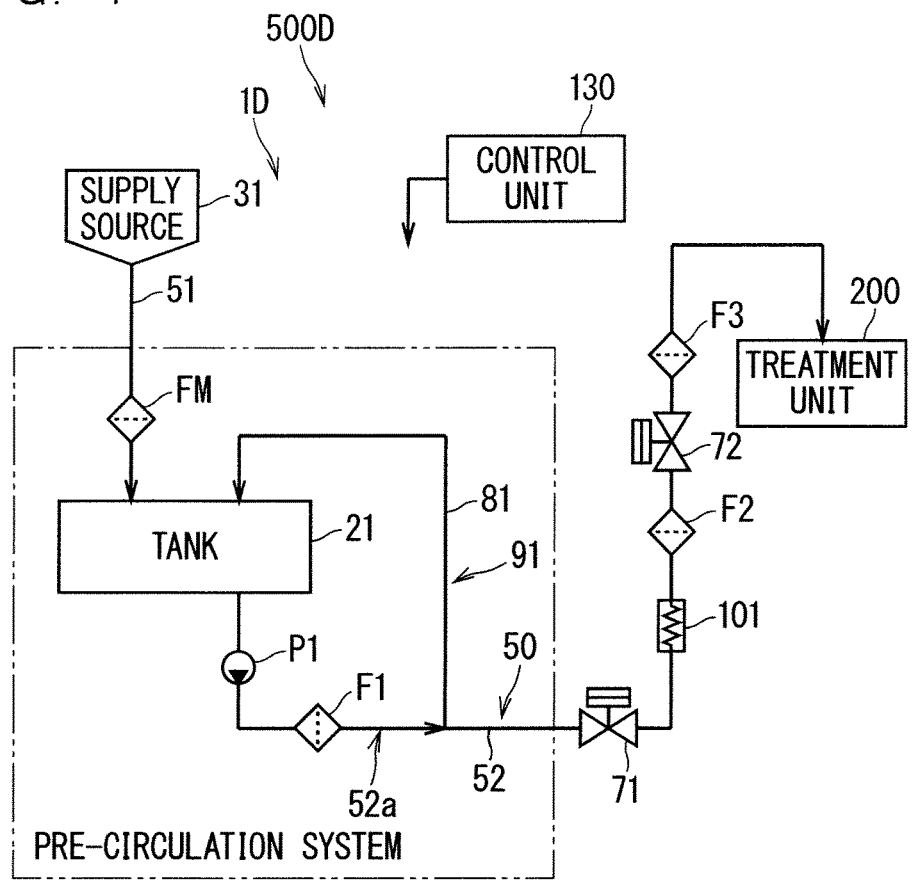
FIG. 4 is a schematic diagram illustrating a schematic configuration of a substrate treatment apparatus including a chemical solution feeder according to a fourth preferred embodiment of the present invention.

The configuration of a substrate treatment apparatus 500D will be described with reference to FIG. 4. FIG. 4 is a schematic diagram illustrating a schematic configuration of the substrate treatment apparatus 500D provided with a chemical solution feeder 1D according to a fourth preferred embodiment.

The substrate treatment apparatus 500D includes the chemical solution feeder 1D and a treatment unit 200. The chemical solution feeder 1D feeds a chemical solution at a higher temperature than a room temperature to the treatment unit 200 being a feed target of the chemical solution. The substrate treatment apparatus 500D has a configuration similar to that of the substrate treatment apparatus 500B, except that the chemical solution feeder 1D is provided instead of the chemical solution feeder 1B.

<Configuration of Chemical Solution Feeder 1D>

The chemical solution feeder 1D feeds a chemical solution at high temperature with a small particle content to the treatment unit 200. The chemical solution feeder 1D includes a feed flow path 50, a filter F1, a heater 101, and a filter F2, and further includes a control unit 130. The chemical solution feeder 1D is configured similarly to the chemical solution feeder 1B, except that a filter F3 is further provided closer to the treatment unit 200 than the valve 72 in the pipe 52.

The filter F3 further filters the chemical solution at high temperature, having passed through the filter F2, to remove particles in the chemical solution. As with the filter F2, the filter F3 filters out particles with its pores to remove the particles in the chemical solution.

<4-2. Operation of Chemical Solution Feeder 1D>

The chemical solution feeder 1D is configured similarly to the chemical solution feeder 1B, except that the filter F3 is further provided. Thus, after the second removal step using the filter F2, the chemical solution feeder 1D further removes particles in a chemical solution at high temperature using the filter F3. The chemical solution is fed to the treatment unit 200. The chemical solution feeder 1D operates similarly to the chemical solution feeder 1B, except that a removal treatment for removing particles with the filter F3 is performed.

5. Fifth Preferred Embodiment

<5-1. General Configuration of Substrate Treatment Apparatus 500E>

Figure 5:
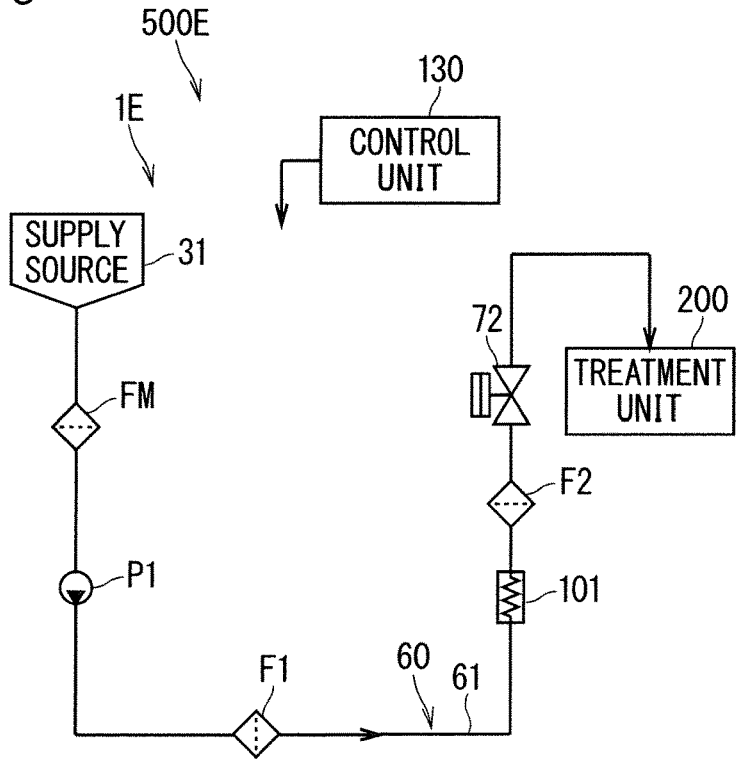
FIG. 5 is a schematic diagram illustrating a schematic configuration of a substrate treatment apparatus including a chemical solution feeder according to a fifth preferred embodiment of the present invention.

The configuration of a substrate treatment apparatus 500E will be described with reference to FIG. 5. FIG. 5 is a schematic diagram illustrating a schematic configuration of the substrate treatment apparatus 500E provided with a chemical solution feeder 1E according to a fifth preferred embodiment.

The substrate treatment apparatus 500E includes the chemical solution feeder 1E and a treatment unit 200. The chemical solution feeder 1E feeds a chemical solution at a higher temperature than a room temperature to the treatment unit 200 being a feed target of the chemical solution. The treatment unit 200 applies treatment to a substrate W using the high-temperature chemical solution fed from the chemical solution feeder 1E.

<Configuration of Chemical Solution Feeder 1E>

The chemical solution feeder 1E feeds a chemical solution at high temperature with a small particle content to the treatment unit 200 being a feed target of the chemical solution. The chemical solution feeder 1E includes a feed flow path (also referred to as a "feed system" or "chemical solution feed system") 60, a filter F1, a heater 101, and a filter F2. The feed flow path 60 is communicatively connected at its one end to the supply source 31, and at its other end to the treatment unit 200. More specifically, the feed flow path 60 includes a pipe 61 that is communicatively connected at its one end to the supply source 31, and at its other end to the treatment unit 200. The pipe 61 is provided with the filter F1, the heater 101, and the filter F2. The heater 101 is provided on the outer peripheral surface of the pipe 61 so as to surround the pipe 61, for example. The feed flow path 60 guides the chemical solution fed from the supply source 31 to the treatment unit 200.

In the feed flow path 60 (pipe 61), the filter F1, the heater 101, and the filter F2 are provided in this order from a supply source 31 side toward a treatment unit 200, or along a flowing direction of the chemical solution in the feed flow path 60.

The feed flow path 60 is further provided with a metal removal filter FM, a pump P1, and a valve 72. The metal removal filter FM is provided closer to the supply source 31 than the filter F1. The valve 72 is provided closer to the treatment unit 200 than the filter F2.

The filter F1 filters a chemical solution at room temperature injected from the supply source 31 into the feed flow path 60 to remove particles in the chemical solution. The heater 101 heats the chemical solution having passed through the filter F1. The filter F2 filters a chemical solution heated to a high temperature by the heater 101, flowing through the feed flow path 60 toward the treatment unit 200, to remove particles in the chemical solution.

The filter F1 filters out particles with its pores and chemically adsorbs particles to remove the particles in the chemical solution. The filter F2 filters out particles with its pores to remove the particles in the chemical solution. The filter F2 has less temperature dependence of particle removing capability than the filter F1. The filter F1 is a hydrophilic filter, for example, and the filter F2 is a hydrophobic filter, for example.

<5-2. Operation of Chemical Solution Feeder 1E>

Next, an example of operation of the chemical solution feeder 1E will be described. The chemical solution feeder 1E performs the operation illustrated in FIG. 7.

As illustrated in FIG. 7, the chemical solution feeder 1E performs a particle removal treatment ("first removal step") for removing particles in a chemical solution at room temperature in step S10. The first removal step is a step in which the chemical solution feeder 1E removes particles in a chemical solution at room temperature injected from the supply source 31 into the feed flow path 60 with the filter F1. More accurately, before passing through the filter F1 along the feed flow path 60, the chemical solution passes through the metal removal filter FM to be filtered by the metal removal filter FM, so that a predetermined metal is removed, and then the filter F1 removes particles.

In step S20, the chemical solution feeder 1E applies a heat treatment ("heating step") to the chemical solution at room temperature from which particles have been removed in the first removal step. The heating step is a step in which the chemical solution feeder 1E heats the chemical solution having passed through the filter F1 by using the heater 101 provided in a portion of the feed flow path 60, closer to the treatment unit 200 than the filter F1.

In step S30, the chemical solution feeder 1E performs particle removal treatment ("second removal step") for removing particles in the chemical solution heated to a high temperature in the heating step. The second removal step is a step in which the chemical solution feeder 1E removes particles in the chemical solution at high temperature heated in the heating step, flowing through the feed flow path 60 toward the treatment unit 200, with the filter F2.

In step S40, the chemical solution feeder 1E feeds the chemical solution at high temperature from which the particles have been removed in the second removal step to the treatment unit 200 so that treatment using the chemical solution is applied to a substrate W.

It is preferable that a chemical solution having treatment capability increasing as temperature increases is used for each of the chemical solution feeders 1A to 1E. As such a chemical solution, there is used an organic solvent such as IPA used for drying treatment of a substrate W, for example. The chemical solution being an organic solvent is not limited to IPA. In addition, use of the chemical solution is not limited to drying. As the chemical solution, ketones (acetone, diethyl ketone, etc.), ethers (methyl ether, ethyl ether, etc.), or polyhydric alcohols (ethylene glycol, etc.) may be used, for example.

In addition, as the chemical solution, sulfuric acid, SC-1 (a mixed solution of ammonia and a hydrogen peroxide solution), SC-2 (a mixed solution of hydrochloric acid and a hydrogen peroxide solution), or the like can be used other than an organic solvent, for example. SC-1 is a chemical solution used for cleaning treatment for removing unnecessary substances such as particles and various metallic impurities, for example, and SC-2 is a chemical solution used for washing or etching treatment for removing unnecessary substances such as particles and various metallic impurities, for example. These chemical solutions each are temperature-adjusted to 40 to 60° C., for example, and are fed to the treatment unit 200.

As the chemical solution, SPM (a mixed solution of sulfuric acid and a hydrogen peroxide solution) used for treatment for stripping a resist on a substrate also may be used, for example. The SPM is temperature-adjusted to 100° C. or more (e.g., 160° C.), for example, and is fed to the treatment unit 200.

While the above-mentioned chemical solution feeders 1A and 1C each are provided with both the pre-circulation system and the main circulation system, the chemical solution feeders 1A and 1C each may be provided with only the main circulation system out of the pre-circulation system and the main circulation system.

While the above-mentioned chemical solution feeders 1A to 1E each use the heater 101 as a heating unit, the heating unit is not limited to a heater. The heating unit may heat a chemical solution by mixing a chemical solution at high temperature into a chemical solution at room temperature, filtered by the filter F1, for example. It is preferable that particles are preliminarily removed from the chemical solution at high temperature to be mixed.

When SPM is used as the chemical solution, the heating unit may have a configuration in which a hydrogen peroxide solution is mixed with sulfuric acid to generate reaction heat so that the chemical solution is heated to high temperature by the reaction heat.

Any one of the chemical solution feeders according to first to fifth preferred embodiments configured as described above uses the filter F1 being a hydrophilic filter that can efficiently remove particles in a chemical solution at room temperature by filtering out and chemically adsorbing the particles. The filter F2 is a hydrophobic filter that removes particles in a chemical solution by filtering the particles, so that even a chemical solution increased in temperature from room temperature to high temperature does not much deteriorate particle removing capability of the filter F2. According to the present invention, the filter F1 having a high particle removing capability for a chemical solution at room temperature is capable of efficiently removing particles from a chemical solution at the room temperature, and the filter F2 having a particle removing capability with a small fluctuation caused by changes in temperature is capable of further removing particles remaining in the chemical solution after the chemical solution is heated to a high temperature. This enables the chemical solution at high temperature, from which the particles have been removed efficiently, to be fed.

Any one of the methods for feeding a chemical solution according to first to fifth preferred embodiments as described above also enables the filter F1 to efficiently remove particles in a chemical solution at room temperature by filtering out and chemically adsorbing the particles. The filter F2 removes particles by filtering the particles and has the particle removing capability with less temperature dependence than the filter F1, so that even a chemical solution increased in temperature from room temperature to high temperature does not much deteriorate the particle removing capability of the filter F2. According to the present invention, the filter F1 having a high particle removing capability for a chemical solution at room temperature is capable of efficiently removing particles from a chemical solution at the room temperature, and the filter F2 having a particle removing capability with a small fluctuation caused by changes in temperature is capable of further removing particles remaining in the chemical solution after the chemical solution is heated to a high temperature. This enables the chemical solution at high temperature, from which the particles have been removed efficiently, to be fed.

Any one of the chemical solution feeders and the methods for feeding a chemical solution, according to first to fourth preferred embodiments, also enables particles in a chemical solution at room temperature to be repeatedly removed with the filter F1 provided in the annular circulation flow path 91 formed by a part of the feed flow path 40 (50) and the return pipe 81 while circulating the chemical solution through the annular circulation flow path 91. This enables improvement in removal efficiency of particles with the filter F1.

Any one of the chemical solution feeders and the methods for feeding a chemical solution, according to first to fourth preferred embodiments, also enables a chemical solution at room temperature to be efficiently circulated through the circulation flow path 91 by closing a flow path formed by a portion of the feed flow path 40 (50), closer to the treatment unit 200 than the circulation flow path 91, with the valve 71 provided closer to the supply source 31 than the heater 101. This enables further improvement in removal efficiency of particles in a chemical solution at room temperature with the filter F1.

Any one of the chemical solution feeders and the methods for feeding a chemical solution, according to first to fourth preferred embodiments, also causes the feed flow path 40 (50) to include the tank 21 that forms a part of the circulation flow path 91 and is capable of storing a chemical solution, and causes the return pipe 81 to branch from a portion of the feed flow path 40, closer to the treatment unit 200 than the tank 21, to be connected to the tank 21. This enables circulation of a chemical solution through the circulation flow path 91 to be smoothened by a buffer action of the tank 21. This enables improvement in removal efficiency of particles with the filter F1.

Any one of the chemical solution feeders and the methods for feeding a chemical solution, according to first to third preferred embodiments, causes the heater 101 and the filter F2 to be provided in the annular circulation flow path 92 for a chemical solution at high temperature, formed by a part of the feed flow path 40, and the return pipe 82. Thus, while a chemical solution at high temperature is circulated in the circulation flow path 91 for a chemical solution at high temperature, particles in the chemical solution can be repeatedly removed with the filter F2. This enables further improvement in removal efficiency of particles in the chemical solution at high temperature with the filter F2.

Any one of the chemical solution feeders and the methods for feeding a chemical solution, according to first to fifth preferred embodiments, causes the filter F1 to have a pore diameter less than a pore diameter of the filter F2, so that removal efficiency of particles in a chemical solution at room temperature with the filter F1 can be improved.

Any one of the substrate treatment apparatuses and the methods for treating a substrate, according to first to fifth preferred embodiments, enables the treatment unit to receive a chemical solution at high temperature, from which particles have been removed efficiently, from the chemical solution feeder, to treat a substrate with the chemical solution.

While the present invention has been shown and described in detail, the above description is illustrative and not restrictive in all aspects. Thus, the preferred embodiments of the present invention can be appropriately modified or eliminated within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A chemical solution feeder for feeding a chemical solution to a predetermined feed target, the chemical solution feeder comprising:
   a feed flow path that is connected at its one end to a supply source of said chemical solution at room temperature, and at its other end to said feed target, to guide said chemical solution to said feed target from said supply source;
   a first filter that is provided in said feed flow path to remove particles in said chemical solution at room temperature injected from said supply source to said feed flow path;
   a heating unit that heats said chemical solution in a portion of said feed flow path, closer to said feed target than said first filter; and
   a second filter that is provided in a portion of said feed flow path, closer to said feed target than said first filter, to remove particles in said chemical solution at high temperature, heated by said heating unit, flowing through said feed flow path toward said feed target,
   wherein said first filter is a hydrophilic filter and said second filter is a hydrophobic filter.

2. The chemical solution feeder according to claim 1, wherein
   said feed flow path includes a return pipe that branches from said feed flow path at a portion closer to said supply source than said heating unit, and that is connected again to said feed flow path at a portion closer to said supply source than the portion where said return pipe branches from said feed flow path, and
   said first filter is provided in an annular circulation flow path formed by a part of said feed flow path and said return pipe.

3. The chemical solution feeder according to claim 2, further comprising:
   a valve capable of opening and closing a flow path formed by a part of the feed flow path, closer to said feed target than said annular circulation flow path, at a position closer to said supply source than said heating unit.

4. The chemical solution feeder according to claim 2, wherein
said feed flow path includes a tank that forms a part of said annular circulation flow path and is capable of storing said chemical solution, and
said return pipe branches from a portion of said feed flow path, closer to said feed target than said tank, to be connected to said tank.

5. The chemical solution feeder according to claim 1, wherein
said feed flow path further includes a return pipe for a chemical solution at high temperature, the return pipe branching from a portion of said feed flow path, closer to said feed target than said heating unit, and connecting to said feed flow path again at a position closer to said supply source than the portion where said return pipe branches from said feed flow path, and
said heating unit and said second filter are provided in an annular circulation flow path for a chemical solution at high temperature, the annular circulation flow path being formed by a part of said feed flow path and said return pipe for a chemical solution at high temperature.

6. The chemical solution feeder according to claim 1, wherein
said first filter has a pore diameter less than a pore diameter of said second filter.

7. A substrate treatment apparatus comprising:
the chemical solution feeder according to claim 1; and
a treatment unit as said feed target,
wherein said treatment unit applies a chemical solution fed from said chemical solution feeder to a substrate to treat the substrate.

8. A method for feeding a chemical solution to a predetermined feed target, the method comprising:
a first removal step of removing particles in said chemical solution at room temperature injected from a supply source into a feed flow path that is connected at its one end to said supply source for said chemical solution at room temperature, and at its other end to said feed target, and that guides said chemical solution to said feed target from said supply source, the particles being removed with a first filter provided in said feed flow path;
a heating step of heating said chemical solution in a portion of said feed flow path, closer to said feed target than said first filter, with a heating unit; and
a second removal step of removing particles in said chemical solution at high temperature, heated in said heating step, flowing through said feed flow path toward said feed target, with a second filter provided in a portion of said feed flow path, closer to said feed target than said first filter,
wherein
said first filter removes particles by filtering and chemically adsorbing the particles, and
said second filter removes particles by filtering the particles, said second filter having a particle removing capability with less temperature dependence than the first filter.

9. The method for feeding a chemical solution according to claim 8, wherein
said first removal step is a step in which while said chemical solution at room temperature is circulated along an annular circulation flow path provided in said feed flow path, said particles are removed with said first filter provided in said annular circulation flow path,
said annular circulation flow path is formed by a return pipe and a part of said feed flow path, and
said return pipe branches from a portion of said feed flow path, closer to said supply source than said heating unit, to be connected to said feed flow path again at a position closer to said supply source than the portion where said return pipe branches from said feed flow path.

10. The method for feeding a chemical solution according to claim 9, wherein
said first removal step is a step in which under conditions where a flow path formed by a portion of said feed flow path, closer to the feed target than said annular circulation flow path, is closed at a position closer to said supply source than said heating unit, said particles are removed with said first filter while said chemical solution at room temperature are circulated along said annular circulation flow path.

11. The method for feeding a chemical solution according to claim 9, wherein
said feed flow path includes a tank that forms a part of said annular circulation flow path and is capable of storing said chemical solution,
said return pipe branches from a portion of said feed flow path, closer to said feed target than said tank, to be connected to said tank, and
said first removal step is a step of removing said particles with said first filter while said chemical solution at room temperature is circulated along said annular circulation flow path including said tank.

12. The method for feeding a chemical solution according to claim 8, wherein
said heating step is a step of heating said chemical solution flowing through a circulation flow path for a chemical solution at high temperature by using said heating unit provided in said circulation flow path for a chemical solution at high temperature, said second removal step is a step of removing particles from said chemical solution flowing through the circulation flow path for a chemical solution at high temperature with said second filter provided in said circulation flow path for a chemical solution at high temperature,
said circulation flow path for a chemical solution at high temperature is formed by a return pipe for a chemical solution at high temperature and a part of said feed flow path, and
said return pipe for a chemical solution at high temperature branches from a portion of said feed flow path, closer to said feed target than said heating unit, to be connected to said feed flow path again at a position closer to said supply source than the portion where said return pipe branches from said feed flow path.

13. The method for feeding a chemical solution according to claim 8, wherein
said first filter has a pore diameter less than a pore diameter of said second filter.

14. A method for treating a substrate comprising:
the method for feeding a chemical solution according to claim 8; and
a treatment step of treating a substrate by using a treatment unit as said feed target,
wherein said treatment unit applies a chemical solution, fed by said method for feeding a chemical solution, to said substrate to treat the substrate.

* * * * *